United States Patent
Kim et al.

(10) Patent No.: US 9,876,156 B2
(45) Date of Patent: Jan. 23, 2018

(54) THERMOELECTRIC GENERATOR MODULE AND METHOD FOR MANUFACTURING THE SAME

(71) Applicant: KOREA UNIVERSITY RESEARCH AND BUSINESS FOUNDATION, Seoul (KR)

(72) Inventors: Sang Sig Kim, Seoul (KR); Kyoung Ah Cho, Seoul (KR); Jin Yong Choi, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 29 days.

(21) Appl. No.: 14/845,728

(22) Filed: Sep. 4, 2015

(65) Prior Publication Data
US 2016/0079508 A1 Mar. 17, 2016

(30) Foreign Application Priority Data
Sep. 11, 2014 (KR) ........................ 10-2014-0120482

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ................................. H01L 35/32; H01L 35/34
See application file for complete search history.

(56) References Cited

U.S. PATENT DOCUMENTS

| 6,043,982 A * | 3/2000 | Meissner | H01L 23/38 257/930 |
| 2005/0060884 A1* | 3/2005 | Okamura | H01L 35/32 29/846 |
| 2006/0032526 A1* | 2/2006 | Fukutani | C30B 29/605 136/205 |
| 2008/0017237 A1* | 1/2008 | Bray | H01L 35/26 136/224 |
| 2009/0152873 A1* | 6/2009 | Gangopadhyay | H01L 35/30 290/1 R |
| 2012/0025343 A1* | 2/2012 | Kuekes | H01L 35/32 257/467 |

(Continued)

FOREIGN PATENT DOCUMENTS

KR   10-2010-0003494 A   1/2010
KR   10-2012-0071254 A   7/2012

(Continued)

*Primary Examiner* — Susan D Leong
(74) *Attorney, Agent, or Firm* — Rabin & Berdo, P.C.

(57) ABSTRACT

The present invention provides a thermoelectric generator module including a set of module unit bodies disposed between a hot source and a cold source to serve as fundamental structures for performing thermoelectric power generation and a method of manufacturing the thermoelectric generator module. Each of the module unit bodies comprises: a first electrodes disposed at one of the hot source and the cold source; a second electrode disposed at the other of the hot source and the cold source so as to be spaced apart from the first electrodes; a first nanowire configured to interconnect the first electrode and the second electrode and composed of an n-type or p-type semiconductor; and a second nanowire.

11 Claims, 16 Drawing Sheets

(56) References Cited

U.S. PATENT DOCUMENTS

| | | | |
|---|---|---|---|
| 2012/0152294 A1* | 6/2012 | Kim | H01L 35/16 136/200 |
| 2013/0000688 A1* | 1/2013 | Cho | H01L 35/34 136/200 |
| 2013/0187161 A1* | 7/2013 | Yamazaki | H01L 29/786 257/57 |
| 2016/0251992 A1* | 9/2016 | Kim | F01N 5/025 |

FOREIGN PATENT DOCUMENTS

| | | |
|---|---|---|
| KR | 10-1249292 B1 | 4/2013 |
| KR | 10-2013-0079703 A | 7/2013 |

* cited by examiner

THERMOELECTRIC GENERATOR MODULE AND METHOD FOR MANUFACTURING THE SAME

CROSS-REFERENCE TO RELATED APPLICATIONS

This application claims the benefit of Korean Patent Application No. 10-2014-0120482, filed on Sep. 11, 2014 in the Korean Intellectual Property Office, which is incorporated herein by reference in its entirety.

BACKGROUND OF THE INVENTION

1. Field of the Invention

The present invention relates to a thermoelectric generator module, and more particularly, to a hybrid thermoelectric generator module having a three-dimensional (stereoscopic) structure in which an electrical signal is transferred horizontally by module unit bodies which are in series connected to each other on a plane, and heat is transferred vertically from a common electrode to a first electrode and a second electrode 2. Description of Related Art In general, thermoelectric effect means a reversible and direct energy conversion between heat and electricity. The thermoelectric effect is classified into the Peltier effect which is applied to a cooling field using a temperature difference between both ends of a material formed by a current applied from the outside, and the Seebeck effect which is applied to a power generation field using an electromotive force generated from a temperature difference between both ends of a material.

Thermoelectric cooling employing the Peltier effect is a vibration-free and low-noise eco-friendly cooling technology which does not make use of a refrigerant gas causing environmental problems, and application areas can be widen to a general-purpose cooling field including a refrigerator, an air conditioner or the like through the development of a high-efficiency thermoelectric cooling material.

Also, in the case of a thermoelectric power generation technology employing the Seebeck effect, if a thermoelectric material is applied to heat dissipating equipment or a relevant section in an automobile engine, an industrial plant or the like, power generation can be performed by a temperature difference between both ends of the material. In spacecrafts for remote planets in which the use of a solar energy is impossible, such a thermoelectric power generation system is already in operation.

The thermoelectric generator module is a circuit in which p-type or n-type conductors or semiconductors are electrically connected with each other end to end so that current is caused to flow by means of a thermo-electromotive force generated when one side of the module is used as a hot source and the other side of the module is used as a cold source.

Currently, the development of a thermoelectric generator module using nanowires is in progress to achieve the compactness of such a thermoelectric generator module. An example of this technology is disclosed in Korean Patent No. 1249292 (registered on Mar. 26, 2013, and hereinafter, referred to as 'prior art 1') entitled "Thermoelectric Device, Thermoelectric Device Module, and Method of Forming the Thermoelectric Device".

The thermoelectric device of the prior art 1 includes: a semiconductor nanowire of a first conductivity type including at least one first barrier region; a semiconductor nanowire of a second conductivity type including at least one second barrier region; a first electrode connected to one end of the first conductivity type semiconductor nanowire; a second electrode connected to one end of the second conductivity type semiconductor nanowire; and a common electrode connected to the other end of the first conductivity type semiconductor nanoparticle and the other end of the second conductivity type semiconductor nanoparticle.

A thermoelectric device module including the thermoelectric device of the prior art 1 is configured such that the first conductivity type semiconductor nanowire and the second first conductivity type semiconductor nanowire serve as bridges which interconnect the first electrode, the second electrode, and the common electrode. Such a bridge forming structure has a limitation in improving the performance and the degree of freedom of design of the thermoelectric device module in that the manufacturing process is made complicated as well as only the manufacture of an alternative structure is permitted.

In addition, as an example of a method of manufacturing a thermoelectric device using nanowires, there is disclosed Korean Patent Laid-Open Publication No. 10-2012-71254 (laid-open on Jul. 2, 2012, and hereinafter, referred to as 'prior art 2') entitled "Thermoelectric Device and Method of Manufacturing the Same.

The manufacturing method of a thermoelectric device of the prior art 2 includes: a structuring forming step of depositing and patterning a semiconductor layer on a substrate to form a first nanowire pattern, a second nanowire pattern, a low-temperature section, and a high-temperature section; a nanowire forming step of ion-injecting a first conductivity type material and a second conductivity type material into the first nanowire pattern and the second nanowire pattern, respectively, to form a first nanowire and a second nanowire; an insulation layer forming step of depositing and patterning an insulation material on the entire surface of the substrate to form an insulation layer on the first nanowire and the second nanowire; a first metal layer forming step of depositing and patterning a metal material on the entire surface of the substrate to form a first metal layer on the insulation layer on the first nanowire; and a second metal layer forming step of depositing and patterning a metal material on the entire surface of the substrate to form a second metal layer on the insulation layer on the second nanowire.

However, the prior art 2 also entails a problem in that since various steps are required which include the pattern formation, the insulation layer formation, the metal layer formation, and the like in order to form the first nanowire and the second nanowire, the manufacturing process is complicated, and there is a limitation in the increase in the performance of the thermoelectric device module similarly to the prior art 1. In addition, the manufacturing method of a thermoelectric device of the prior art 2 is a manufacturing method employing an alternative structure, and thus a problem is caused in that the degree of freedom of design of the thermoelectric device module is decreased.

SUMMARY OF THE INVENTION

Accordingly, the present invention has been made to solve the above-mentioned problems occurring in the prior arts, and it is an object of the present invention to provide a hybrid thermoelectric generator module and a method for manufacturing the same, in which an electrode-connecting bridge of the thermoelectric generator module can be manufactured using nanowires to improve the power generation performance of the thermoelectric generator module, the manufacturing process and structure of the thermoelectric generator module can be simplified to reduce the manufacturing cost, the development of a thermoelectric generator module having a compact structure is possible, and a bridge structure employing electrodes and nanowires can be arranged in various manners to increase the degree of freedom of design of the thermoelectric device module.

To achieve the above object, in one aspect, the present invention provides a thermoelectric generator module including a set of module unit bodies 10 disposed between a hot source and a cold source to serve as fundamental structures for performing thermoelectric power generation, wherein each of the module unit bodies 10 includes: a first electrode disposed at one of the hot source and the cold source; a second electrode disposed at the other of the hot source and the cold source so as to be spaced apart from the first electrodes; a first nanowire 50 configured to interconnect the first electrode and the second electrode and composed of an n-type or p-type semiconductor; and a second nanowire 60 composed of a conductor or semiconductor of a type different from the type of the semiconductor forming the first nanowire 50, the second nanowire 60 being connected at one end thereof to the first electrode and connected at the other end thereof to a second electrode of another module unit body adjoining to the module unit body 10.

In the thermoelectric generator module, the first electrodes and the second electrode may be disposed on a co-plane, one of the first nanowire 50 and the second nanowire 60 may extend from the first electrode 20 and may be connected to the second electrode 30 in the same module unit body, which is disposed so as to be spaced apart from the first electrode 20, and the other of the first nanowire and the second nanowire 60 may be connected to the second electrode 30 in the adjoining module unit body. The first electrode, the first nanowire 50, and the second nanowire 60 of at least one of the module unit bodies 10 may form a " ᴄ " shape.

In the thermoelectric generator module, the module unit bodies including the module unit body consisting of the first electrodes, the first nanowire 50, and the second nanowire 60, which form the " ᴄ " shape, may be consecutively arranged in series on the flexible substrate 100 to capture any one heat source.

In the thermoelectric generator module, each of the module unit bodies 10 may include a substrate 100 disposed between the hot source and the cold source. The second electrode, the first nanowire, and the second nanowire may be disposed on one side of the substrate, and the first electrode may be disposed so as to penetrate through the substrate in such a manner that the other surface of the first electrode is exposed to the other side of the substrate. A heat shielding protective layer may be disposed on the one side of the flexible substrate between the first electrode and the second electrode.

In the thermoelectric generator module, the heat shielding protective layer may be coated on the other surfaces of the first nanowire, the second nanowire, and the first electrode.

In the thermoelectric generator module, the heat shielding protective layer may include at least one of a ceramic based material such as $ZrO_2$, $SiO_2$, $Al_2O_3$, $TiO_2$, SiC or $ZrO_2$ and polymer.

In the thermoelectric generator module, the substrate may be a flexible substrate.

In the thermoelectric generator module, the flexible substrate may be formed of any one selected from among Polydimethylsiloxane (PDMS), polyimide, polycarbonate, Poly(methyl methacrylate) (PMMA), cyclic olefin copolymer (COC), parylene, polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, cyclic olefin polymer (COP), polyethylene (PE), polyprophylene (PP), polystyrene (PS), polyoxymethylene (POM), poly(ether ether ketone) (PEEK), polyether sulfone (PES), polytetrafluoroethylene (PTFE), polyvinyl chloride (PVC), polyvinylidene fluoride (PVDF), and perfluoroalkyl ethyl acrylate (PFA), or a combination thereof.

In the thermoelectric generator module, the first nanowire 50 and the second nanowire 60 may be connected to the first electrode 20 and the second electrode 30 by a transfer technique.

In the thermoelectric generator module, the first nanowire or the second nanowire may include a phonon choke part having a diameter of 50 nm or less.

In another aspect, the present invention provides a method of manufacturing a thermoelectric generator module, the method including: a first electrode pattern formation step of forming patterns 200 for first electrodes by performing a photolithography process on a silicon wafer 100; a substrate formation step of forming a PDMS substrate layer 300 on the silicon wafer 100; a substrate via formation step of removing the patterns 200 formed on the silicon wafer 100 and forming vias 210 at positions where the patterns 200 are removed; a first electrode deposition pattern formation step of forming a pattern 400 for depositing conductive layers for the first electrodes by performing a photolithography process on only portions where the vias 210 are formed; a first electrode deposition step of depositing conductive layers on the pattern 400 to form first electrodes 500; a substrate layer separation step of separating the PDMS substrate layer 300 on which the first electrodes 500 are deposited from the silicon wafer 100; a nanowire transfer and connection step of transferring first nanowires 50 and second nanowires 60 onto the first electrodes 500 formed on the separated PDMS substrate layer 300 to connect the first nanowires 50 and second nanowires 60 to the first electrodes 500; a second electrode deposition pattern formation step of forming a pattern for depositing conductive layers for the second electrodes by performing a photolithography process on the other ends of the nanowires 50 and 60; a second electrode deposition step of depositing conductive layers on the pattern to form second electrodes 700; and a protective layer formation step of forming a heat shielding protective layer 800 between the first electrode 500 and the second electrode 700.

In the method of manufacturing the thermoelectric generator module, the first nanowires 50 and the second nanowires 60 may be transferred onto a PDMS layer 1500 through the following steps: a step of forming an organic layer to be cured by ultraviolet (UV) rays on the PDMS layer 150; a step of aligning the silicon wafer 1000 on which the silicon nanowires 1400 and 1401 are formed in a suspended state on a top of the PDMS layer 1500 and downwardly applying pressure to the top of the silicon wafer 1000 to cause the nanowires 1400 and 1401 to be embedded into the organic layer 1600 coated on the PDMS layer 1500; a step of removing the silicon wafer 1000 after the nanowires 1400 and 1401 are embedded into the organic layer 1600 and exposing the organic layer 1600 to ultraviolet rays to cure the organic layer 1600; and a step of removing the organic layer 1600 after the curing of the organic layer 1600 is completed.

In still another aspect, the present invention provides a thermoelectric generator module manufactured by the above method.

Advantageous Effects

The thermoelectric generator module and the method of manufacturing the same according to the present invention as constructed above have the following advantageous effects.

The nanowires are formed by a transfer technique so that the manufacturing process and structure of the thermoelectric generator module can be simplified.

In addition, the thermoelectric generator module of the present invention has a structure in which nanowire elements are connected between both electrodes disposed so as to be oriented toward opposite surfaces so that the power generation efficiency and performance can be increased through a consecutive serial connection arrangement structure.

Further, the manufacturing cost of the thermoelectric generator module can be reduced and the thermoelectric generator module can be developed as a compact structure through the simplification of the manufacturing process and structure of the thermoelectric generator module.

Moreover, the present invention is a very advanced invention in that the bridge structure employing electrodes and nanowires is disposed in various patterns, thus leading to an increase in the degree of freedom of design for improving the thermoelectric generation efficiency.

Besides, the thermoelectric generator module of the present invention can maximize the thermoelectric performance by enabling a serial connection arrangement through the implementation of a large area through a structure in which a thermal flow path and an electrical flow path are disposed perpendicularly to each other even in the case where a gap between two heat sources is minimized.

BRIEF DESCRIPTION OF THE DRAWINGS

The above and other objects, features and advantages of the present invention will be apparent from the following detailed description of the preferred embodiments of the invention in conjunction with the accompanying drawings, in which.

Figure 1A:
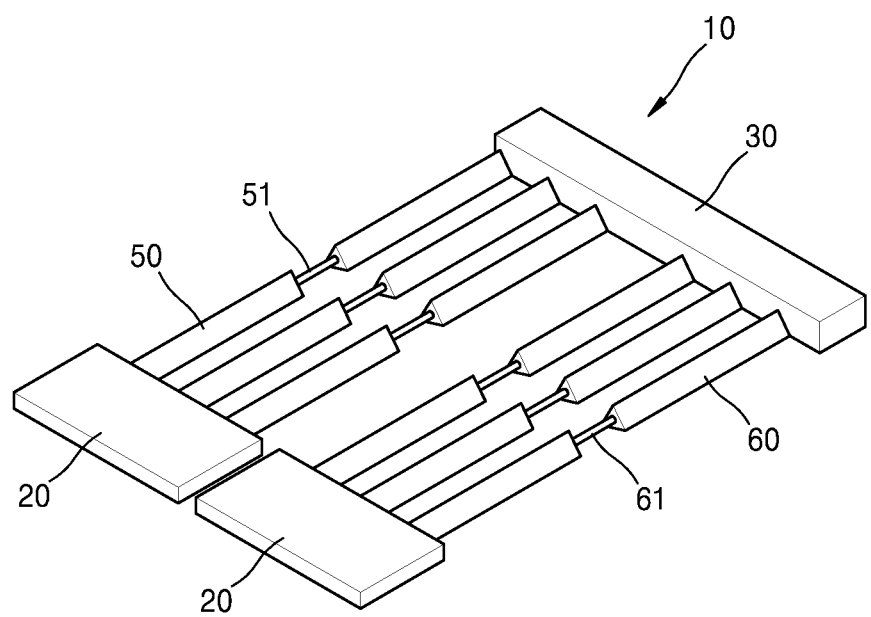
FIG. 1A illustrates is a schematic view illustrating a configuration of a module unit body of a thermoelectric generator module according to an embodiment of the present invention.

EXPLANATION ON REFERENCE NUMERALS
OF MAIN ELEMENTS IN THE DRAWINGS

10: module unit body
20: first electrode
30: second electrode
50: first nanowire
60: second nanowire
70: heat source
100: substrate

DESCRIPTION OF THE PREFERRED
EMBODIMENTS

Hereinafter, a thermoelectric generator module and a method of manufacturing the same according of the present invention will be described in detail with reference to the accompanying drawings.

The drawings to be provided below are provided by way of example so that the idea according to the present invention can be sufficiently transferred to those skilled in the art to which the present invention pertains. Therefore, the present invention is not limited to the drawings presented below, and may be embodied in other forms.

In addition, unless otherwise defined, the terms as used herein have the same meanings as those generally understood by those skilled in the art to which the present invention pertains. In the following description and the accompanying drawings, the detailed description on known related functions and constructions will be omitted to avoid unnecessarily obscuring the subject matter of the present invention hereinafter.

FIG. 1A illustrates is a schematic view illustrating a configuration of a module unit body of a thermoelectric generator module according to an embodiment of the present invention.

The thermoelectric generator module of the present invention includes a set of module unit bodies 10 as a basic fundamental structure for thermoelectric power generation.

Referring to FIG. 1A, the thermoelectric generator module of the present invention includes one or more module unit bodies 10 which are disposed between two heat sources having different temperatures to cause a temperature difference therebetween.

The module unit body 10 which serves as a basic fundamental structure for performing thermoelectric power generation includes a first electrode 20, a second electrode 30, a first nanowire 50, and a second nanowire 60. The first electrode 20 is disposed at one of a hot source and a cold source which are heat sources, and the second electrode 30 is disposed at the other of the hot source and the cold source so as to be spaced apart from the first electrodes. The first nanowire 50 and the second nanowire 60 can be connected to the first electrode 20 and the second electrode 30 by a transfer technique.

In this embodiment, although the first electrode 20 is disposed at the hot source and the second electrode 30 is disposed at the cold source, this configuration is merely an example, and the module unit body 10 may be modified in various manners, such as taking a vice-versa configuration.

The first nanowire 50 is configured to interconnect the first electrode 20 and the second electrode 30 and is composed of an n-type or p-type semiconductor. The second nanowire 60 is composed of a conductor or semiconductor of a type different from the type of the semiconductor forming the first nanowire 50. The second nanowire 60 is connected at one end thereof to the first electrode and is connected at the other end thereof to a second electrode of another module unit body adjoining to the module unit body 10. In other words, when the first nanowire 50 is composed of the n-type semiconductor, the second nanowire 60 is composed of the p-type semiconductor. Contrarily, when the first nanowire 60 is composed of the p-type semiconductor, the second nanowire 60 is composed of the n-type conductor or semiconductor.

Phonon choke parts 51 and 61 may be respectively formed at certain positions, i.e., generally at the central portions of the first nanowire 50 and the second nanowire 60, if necessary. The phonon choke parts 51,61; 1402,1403 have a substantial effective diameter of 50 nm or less, more specifically a diameter ranging from 20 nm to 50 nm. The phonon choke parts may be formed to permit the movement of a charge carrier but limit the movement of phonons so that thermal conductivity due to the nanowires can be substantially interrupted to improve the thermoelectric generation performance.

Figure 1B:
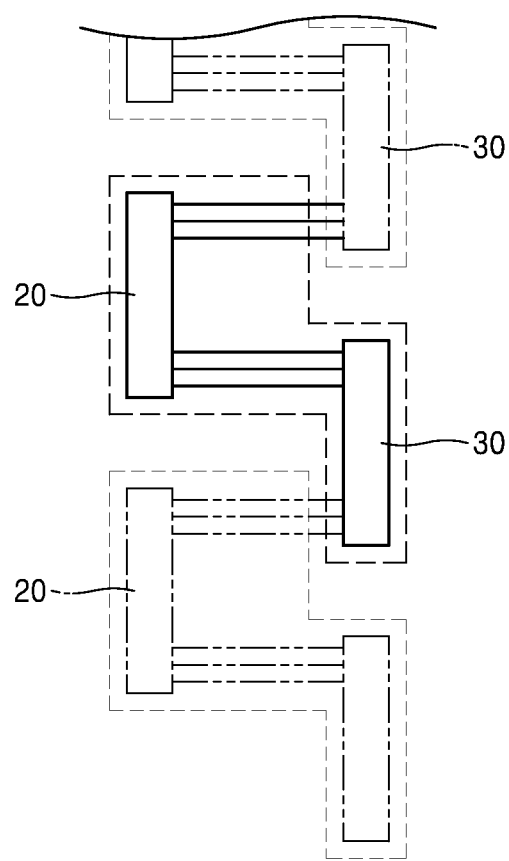
FIG. 1B illustrates a state in which the module unit bodies of a thermoelectric generator module of the present invention are arranged.
Figure 2:
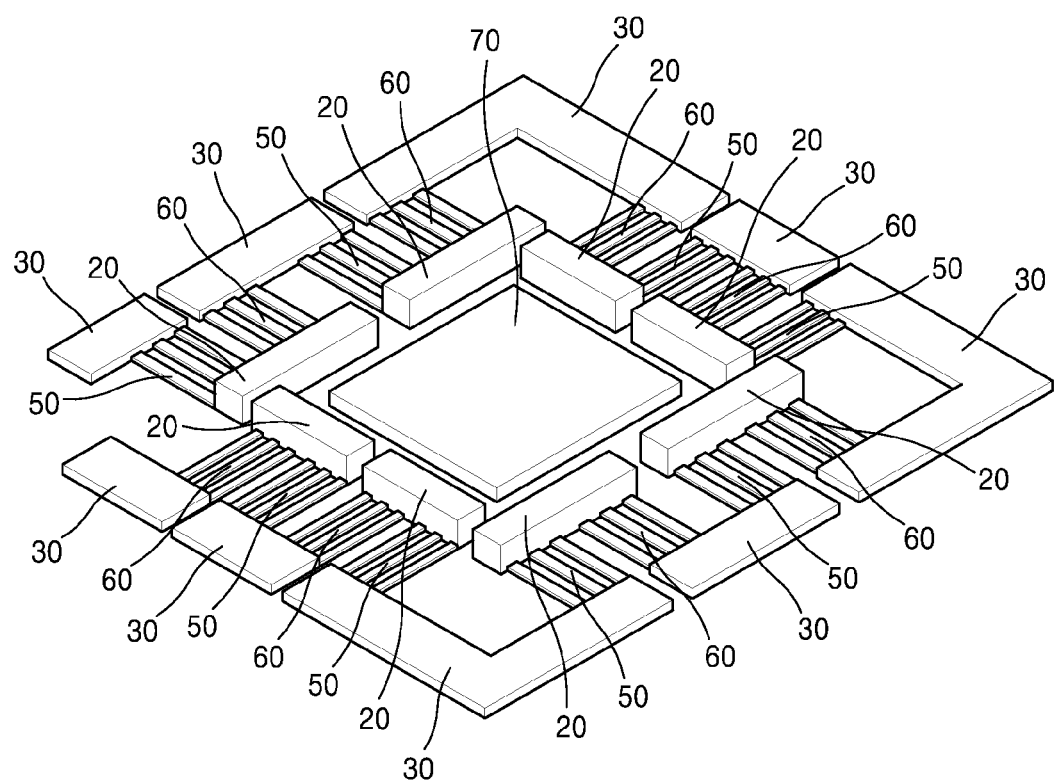
FIG. 2 is a diagrammatical view illustrating an example of a state in which the module unit bodies of a thermoelectric generator module of the present invention are arranged consecutively.

In the module unit body 10 of the thermoelectric generator module of the present invention as constructed above, the first electrode 20 and the second electrode 30 are disposed so as to be opposed to each other, and the first nanowire 50 and the second nanowire 60 are disposed so as to interconnect the first electrode 20 and the second electrode 30. In this embodiment as shown in FIGS. 1a, 1b and 2, the first electrodes and the second electrode are disposed on a co-plane. The first electrode 20 and the second electrode 30 are disposed so as to be spaced apart from each other, and the first nanowire 50 and the second nanowire 60 extend from the first electrode 20 and are connected to the second electrode 30 in the same module unit body, which is disposed so as to be spaced apart from the first electrode 20 and the second electrode 30 in the adjoining module unit body. The first electrode, the first nanowire 50, and the second nanowire 60 of at least one of the module unit bodies 10 can form a "⊏" shape. In other words, although the module unit body 10 can have various arrangement structures, at least one of the module unit bodies 10 of the thermoelectric generator module of the present invention takes a structure in which the first electrode 20 and the second electrode 30 are disposed in parallel with each other so as to be spaced apart from each other in such a manner that when projected to the same segment relative to the longitudinal direction, the first electrode 20 and the second electrode 30 are partially superposed with each other to cause the centers of the first electrode 20 and the second electrode 30 to be spaced apart from each other. In addition, the consecutive connection arrangement of a plurality of module unit bodies including such a module unit body is achieved so that any one of the first nanowire 50 and the second nanowire 60 is connected to the second electrode 30 in the same module unit body and the other of the first nanowire 50 and the second nanowire 60 is connected to a second electrode 30 in another adjoining module unit body. Resultantly, the first electrode 20, the first nanowire 50, and the second nanowire 60 of at least one of the module unit bodies forms a "⊏" shaped structure.

Meanwhile, in this embodiment as shown in FIG. 1A, although the module unit body 10 has a structure in which the first electrode 20 and the second electrode are formed on only a co-plane, it may have a structure in which the first electrode 20 and the second electrode 30 are oppositely disposed in parallel with each other so as to be spaced apart from each other so that they are at least partially disposed on the same plane as each other, and one surfaces of the electrodes permitting the inflow and outflow of heat due to the exposure of each electrode form opposed surfaces of the electrodes. In other words, the first electrode 20 may have a structure in which it is exposed downwardly from the ground surface, and the second electrode 30 may have a structure in which it is exposed upwardly from the ground surface. The flow of heat forms a vertical heat transfer structure through this structure, and the arrangement of the electrodes is achieved on a horizontal plane to enable integration and implementation of a large area of the thermoelectric generator module so that a combined vertical and horizontal hybrid structure capable of maximizing the thermoelectric efficiency can be formed.

In the meantime, the thermoelectric generator module of the present invention may have a structure in which the module unit bodies including the module unit body forming such a "⊏" shape, are consecutively disposed in series on the substrate 100 to capture any one heat source.

FIG. 2 is a diagrammatical view illustrating an example of a state in which the module unit bodies 10 of a thermoelectric generator module of the present invention are arranged consecutively.

As described above, the thermoelectric generator module is configured by forming a square integrated structure in which a plurality of module unit bodies including the "⊏"-shaped module unit bodies 10 formed by being connected by means of the first electrodes 20, the second electrode 30, the first nanoparticle film 50 and the second nanoparticle film 60 are connected in series to form a consecutive arrangement structure.

In addition, through a structure in which any one heat source, i.e., a hot source 70 is disposed at the center of the module unit bodies 10 constituting the square integrated structure and a cold source having a temperature lower than that of the hot source 70 is disposed at the outside of the captured region, thermoelectric power generation is performed by the module unit bodies 10 disposed between the two heat sources, i.e., the hot and cold sources.

In this embodiment of the present invention, the thermoelectric generator module enables the module unit bodies including the module unit body 10 having a shaped structure of the present invention to be arranged consecutively and efficiently so that the compactness of the thermoelectric generator module can be achieved, thereby maximizing the utility of the installation space of the thermoelectric generator module. In an example of such a structure, the thermoelectric generation function can be performed by capturing the surroundings of a high-temperature heating element such as the CPU of a computer. For example, in the case where there is a risk that the performance will be degraded due to the overheating of the CPU or the like, the thermoelectric generator module may have a configuration in which current is applied to the thermoelectric generator module to compulsorily cool the high-temperature hot source element such as the CPU using the Peltier effect.

As described above, in this embodiment, the second electrode 30 is disposed on one surface oriented toward the hot source 70, the first and second electrodes 20 and 30 are disposed to be oriented toward the surface opposite to the surface to which the second electrode 30 is exposed. Herein, although a structure has been illustrated in which the module unit bodies 10 having a "⊏"-shape capture the surroundings of the heat source, this configuration is merely an example of the present invention and the thermoelectric device, i.e., the thermoelectric generator module of the present invention may have a structure in which one surfaces toward which the first and second electrodes are oriented are spaced apart from each other toward the heat source or are brought into close contact with each other to form a surface contact. In particular, a base or substrate on which the thermoelectric generator module is formed is made of a flexible material so that the outer surface of the curved heat source may also have a hybrid stereoscopic structure in which a thermal flow path that forms the surface contact effectively and an electrical flow path intersect each other perpendicularly.

Figure 3A:
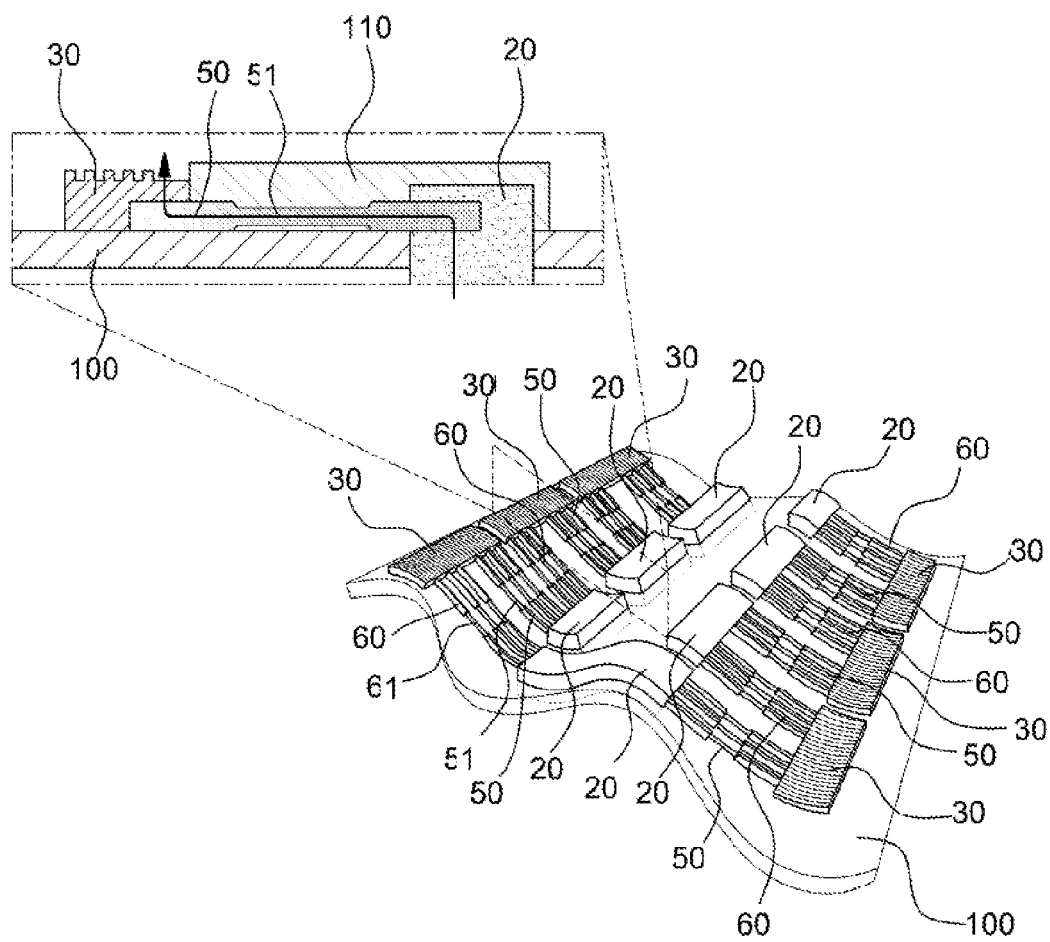
FIG. 3A is a cross-sectional view of a thermoelectric generator module according to the present invention.

FIG. 3A is a cross-sectional view of a thermoelectric generator module having a stereoscopic structure as an example in which the thermoelectric generator module shown in FIG. 2 is expanded. The thermoelectric generator module has a hybrid structure in which the thermal flow path and the electrical flow path intersect with each other perpendicularly. More specifically, the thermoelectric generator module of the present invention further includes a substrate 100. The substrate can be implemented as a flexible substrate. The flexible substrate may be formed of any one selected from among Polydimethylsiloxane (PDMS), polyimide, polycarbonate, Poly(methyl methacrylate) (PMMA), cyclic olefin copolymer (COC), parylene, polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, cyclic olefin polymer (COP), polyethylene (PE), polyprophylene (PP), polystyrene (PS), polyoxymethylene (POM), poly(ether ether ketone) (PEEK), polyether sulfone (PES), polytetrafluoroethylene (PTFE), polyvinyl chloride (PVC), polyvinylidene fluoride (PVDF), and perfluoroalkyl ethyl acrylate (PFA), or a combination thereof.

The second electrode 30, the first nanowire 50, and the second nanowire 60 are disposed on one side of the substrate 100 are disposed on one side of the substrate, and the first electrode 20 is disposed so as to penetrate through the substrate 100 in such a manner that the other surface of the first electrode 20 is exposed to the other side of the substrate. In other words, the first electrode 20 is exposed to the top surface of the substrate 100, and the second electrode 30 is exposed to the underside of the substrate 100. In this case, a heat shielding protective layer 110 is disposed on the one side of the flexible substrate 100 between the first electrode 20 and the second electrode 30. The heat shielding protective layer 110 is coated on the other surfaces of the first nanowire 50, the second nanowire 60, and the first electrode 20 so that the coverage of the heat shielding protective layer 110 reaches the first nanowire 50, the second nanowire 60, and the first electrode 20. Thus, the first nanowire 50, the second nanowire 60, and the first electrode 20 are not exposed to the outside from the one side of the substrate 100, and the second electrode 30 is only at least partially exposed to the outside from the one side of the substrate 100 so that the first nanowire 50, the second nanowire 60, the first electrode 20, and the second electrode 30 perform the heat transfer together with the heat source disposed on the one side of the substrate 100, and the first electrode 20 performs the heat transfer together with a heat source disposed on the other side, i.e., the underside of the substrate 100.

In other words, the thermoelectric generator module of the present invention takes a structure in which other constituent elements are mounted on the flexible substrate 100. One or more module unit bodies 10 are mounted on the substrate 100 in such a manner that the first electrode 20 and the second electrode 30 of the module unit body 10 are in series connected to each other by the first nanowire 50 and the second nanowire 60 that serve as thermoelectric devices, and the heat shielding protective layer 110 is formed on one side of the substrate 100 between the first electrode 20 and the second electrode 30 to completely cover the other surfaces of the first nanowire 50, the second nanowire 60, and the first electrode 20. The heat shielding protective layer 110 serves to expose the first electrode 20 to only a heat source disposed on a bottom surface of the substrate 100 and prevent exposure of the first electrode to other heat source disposed on a top surface of the flexible substrate 100 to give the thermal insulation effect to the thermoelectric generator module, thereby improving the thermoelectric performance, and simultaneously preventing a damage of the constituent elements disposed on one side of the flexible substrate 100 due to introduction of foreign substances from the outside. In this embodiment, the heat shielding protective layer may include at least one of a ceramic based material such as $ZrO_2$, $SiO_2$, $Al_2O_3$, $TiO_2$, SiC or $ZrO_2$ and polymer having an excellent thermal insulation property to perform a heat shielding and protecting function.

In this case, the thermoelectric power generation is performed in the module unit body 10 when a electromotive force caused by the Seebeck effect is generated by a temperature difference of both ends between the first electrode 20 and the second electrode 30 due to a temperature difference between two heat sources disposed perpendicularly centering on the substrate 100 on the module unit body 10, i.e., a hot source disposed at the first electrode 20 side and a cold source disposed at the second electrode 20 side. The thermal flow path takes a vertical heat transfer structure due to the vertical arrangement of the heat source, but the electrical flow path can take a horizontal arrangement structure due to a structure in which the first nanowire 50 or the second nanowire 60 generating the electrical flow of the electromotive force are consecutively connected in series in a direction of being arranged horizontally on the substrate that perpendicularly intersects the heat flow.

The thermoelectric generator module of the present invention has a structure in which the module unit bodies 10 are in series connected to each other on a plane so that an electrical signal is transferred horizontally. As described above, the thermoelectric generator module of the present invention takes a structure in which heat is vertically transferred from the first electrode 20 to the second electrode 30 so that a hybrid thermoelectric generator module having a three-dimensional (or stereoscopic) structure can be implemented in which the electrical signal is transferred horizontally and heat is transferred vertically.

In addition, if the substrate 100 uses a thin layered material having a well-known flexibility, the thermoelectric generator module itself can be formed flexibly or curvedly, and thus the thermoelectric generator module can also be applied to items such as existing dry cells.

Figure 3B:
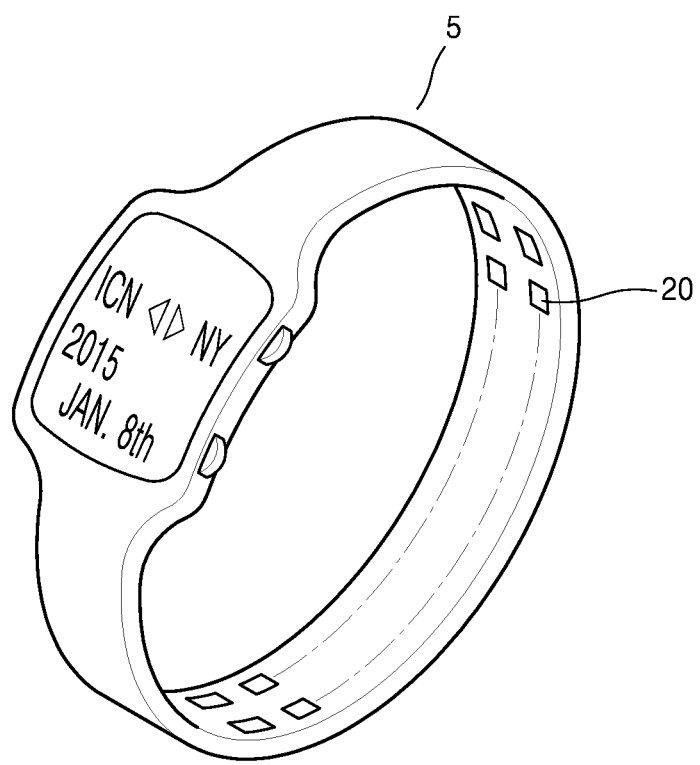
FIGS. 3B to 3D are perspective views illustrating an example of a thermoelectric generator module according to an embodiment of the present invention.
Figure 3C:
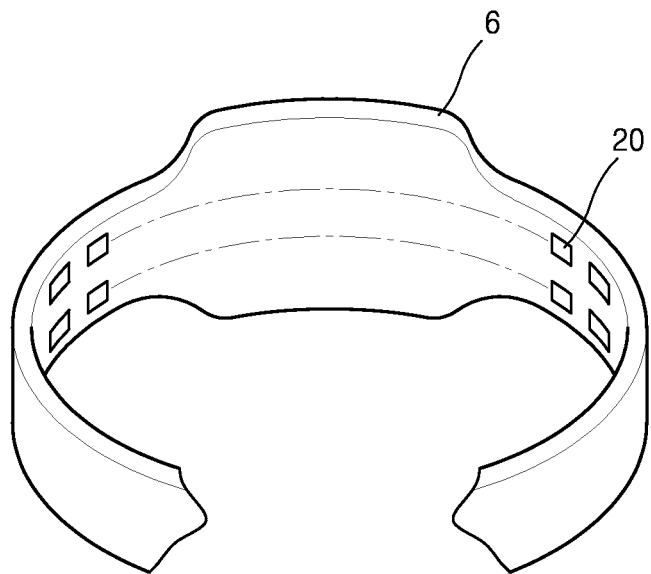
Figure 3D:
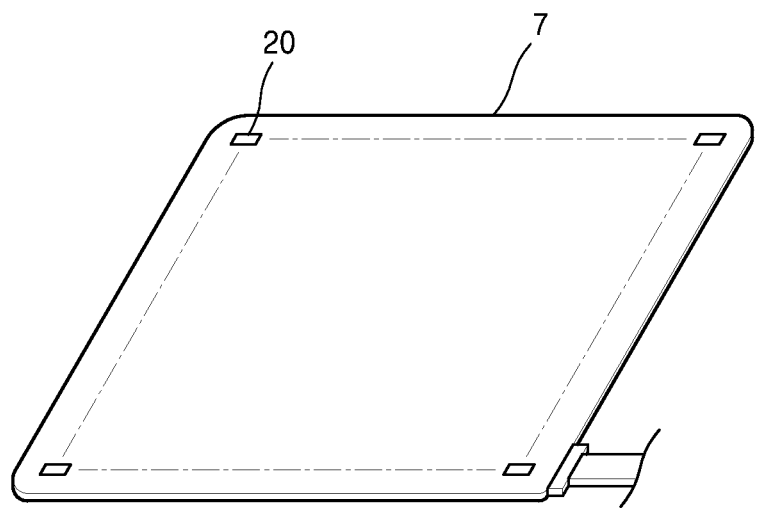

FIGS. 3B to 3D are perspective views illustrating an example of a thermoelectric generator module that is implemented on the flexible substrate. In other words, certain electrodes 20 are disposed on the inner side of a wrist band of a smart watch as a wearable device so that heat emitted from the human body can be used as a hot source to perform the self-power generation function (see FIG. 3B). In addition, certain electrodes 20 are disposed on the inner side of an arm band so that heat suddenly emitted from the body of a person who does an exercise can be used as the hot source to perform the thermoelectric power generation.

Further, the thermoelectric generator module may be formed as a piece of sheet so that certain electrodes are disposed at a hot source using a solar heat as an emergency power generating element and other electrodes are disposed at a cold source such as the lawn. Thus, the thermoelectric generator module can be used an emergency power generating element using a temperature difference between the hot source and the cold source, and the sheet type thermoelectric generator module can be modified in various manners, such as being attached to the outer wall of a building or the like.

Hereinafter, a manufacturing process of a thermoelectric generator module according to an embodiment of the present invention will be described with reference to FIGS. 4A to 4J.

FIGS. 4A to 4J illustrate a manufacturing process chart of a thermoelectric generator module according to an embodiment of the present invention.

The greatest feature of the method of manufacturing the thermoelectric generator module of the present invention resides in that the method include a step of transferring nanowires onto the substrate to connect the nanowires with each electrode. The manufacturing process of the thermoelectric generator module according to the present invention will be described shortly according to steps (a) to (j) enumerated in an alphabetical order in FIGS. 4A to 4J.

Step (a): Formation of First Electrode Pattern

Quadrangular patterns 200 for forming the first electrodes are formed on a silicon wafer 100 using a photolithography method.

More specifically, a photoresist liquid is applied on the silicon wafer 100, and light is allowed to pass through a mask having a corresponding pattern using an exposure device to selectively irradiate light (i.e., exposure process). Then, a developer solution is sprayed onto the mask to thereby form the patterns 200 for formation of the first electrodes on the silicon wafer 100.

It is examined by a measurement device or an optical microscope or with naked eyes whether or not a corresponding pattern is formed properly, if necessary.

Step (b): Formation of Substrate on the Silicon Wafer

After the patterns 200 for the first electrodes 20 are formed, a PDMS (polydimethylsiloxane) layer 300 is formed on the silicon wafer 200 through a known surface treatment process.

The PDMS is a multi-purpose polymeric material that is used in the surface treatment during the manufacture of oils, emulsions, compounds, lubricants, resins, elastomers, rubbers, etc.

In this embodiment, the PDMS was used for a substrate layer, but the present invention is not limited thereto and various materials can be used.

Step (c): Formation of Substrate Vias by Removal of the Patterns 200

After the PDMS substrate layer, i.e., the substrate layer 300 is formed, the patterns 200 formed on the silicon wafer 100 are removed through a known lift-off process. If the patterns 200 are removed from the silicon wafer 100, a PDMS substrate layer 300 having vias (i.e., through-holes) 210 formed at positions where the patterns 200 are removed is formed.

Step (d): Formation of First Electrode Deposition Pattern

A photolithography process is performed on only portions where the vias 210 are formed on the PDMS substrate layer 300 to form a quadrangular pattern 400 for depositing conductive layers for the first electrodes.

Figure 4A:
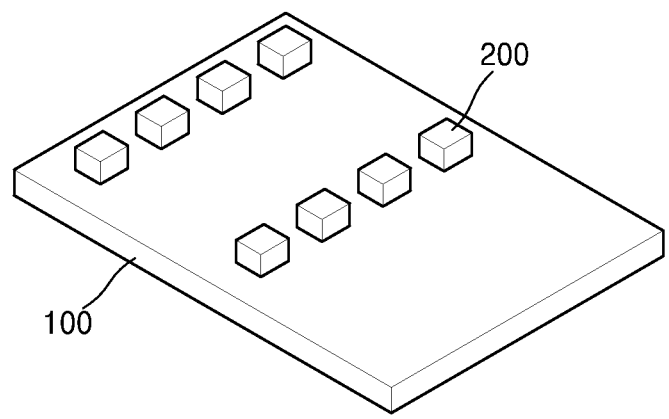
FIGS. 4A to 4J respectively illustrate a manufacturing process chart of a thermoelectric generator module according to the present invention.
Figure 4B:
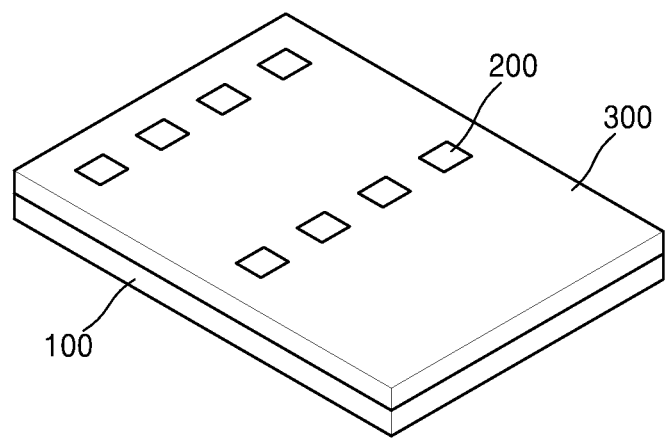
Figure 4C:
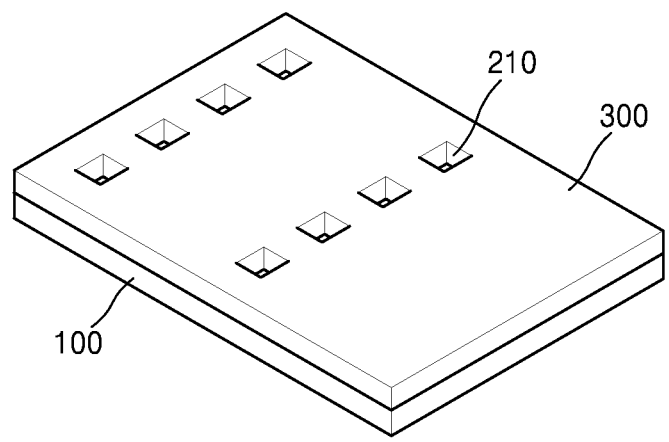
Figure 4D:
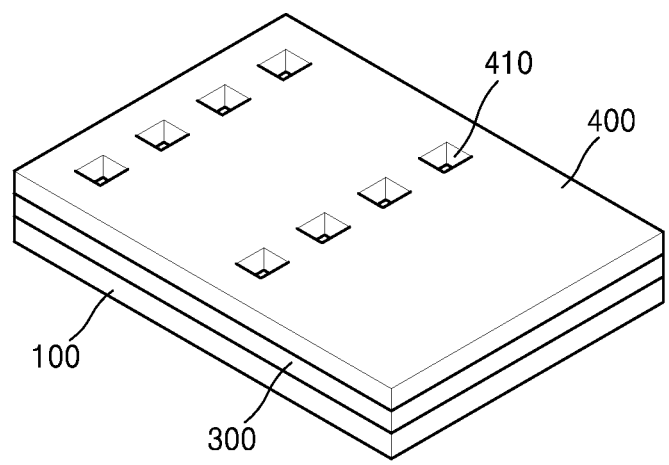
Figure 4E:
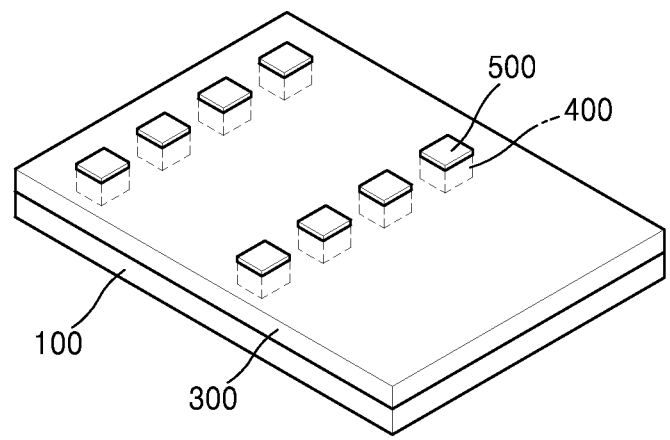
Figure 4F:
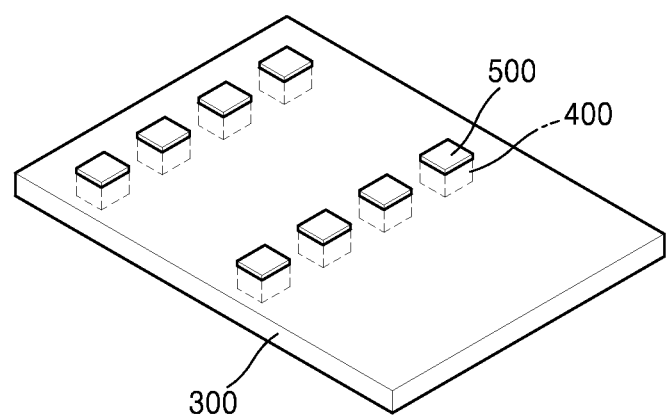
Figure 4G:
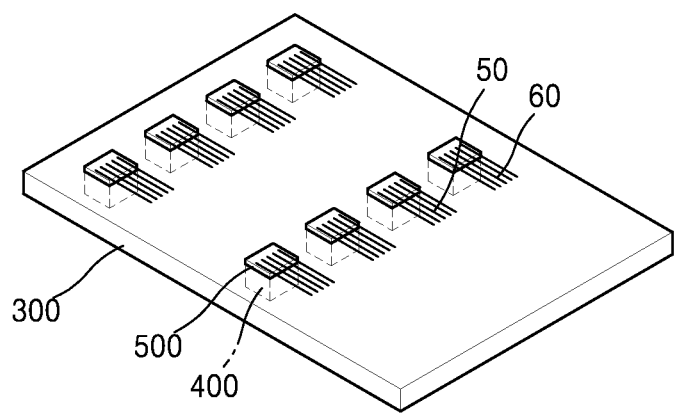

Herein, a figure of step (d) shown in FIG. 4D illustrates a state in which vias 410 are formed on a photoresist layer 400 remained as a subsequent pattern 400 to correspond to the positions of the vias 210 formed on the PDMS substrate layer 300. Then, after an exposure process and a development process are performed, a pattern 400 for depositing the conductive layers for the first electrodes are formed on only the portions where the vias 210 are formed on the PDMS substrate layer 300 as shown in a figure of step (e).

Step (e): Deposition of First Electrode

After the pattern 400 is formed on the PDMS substrate layer 300 as described above, a conductive layer having a good electrical conductivity is deposited on the pattern 400 through a known vacuum thermal evaporation process or sputter deposition process to form a first electrode 500.

Step (f): Separation of PDMS Substrate Layer 300 from Silicon Wafer 100

After the first electrodes 500 are formed, the PDMS substrate layer 300 is separated from the silicon wafer 100.

Step (g): Transfer and Connection of Nanowires

As described above, in the step having the greatest feature in the manufacture method of the thermoelectric generator module of the present invention, the first nanowires 50 and the second nanowires 60 are transferred onto the first electrodes 500 formed on the patterns 400 of the separated PDMS substrate layer 300 to connect the first and second nanowires 50 and 60 to the first electrodes 500. The detailed process for the transfer of the nanowires will be described later with reference to FIGS. 5A to 5F.

Step (h): Formation of Second Electrode Deposition Pattern

After the first and second nanowires 50 and 60 are transferred onto the first electrodes 500, a photolithography process is performed on the other ends of the nanowires 50 and 60 connected at one ends thereof to the first electrodes 500 to form a quadrangular pattern for depositing conductive layers for second electrodes.

Figure 4H:
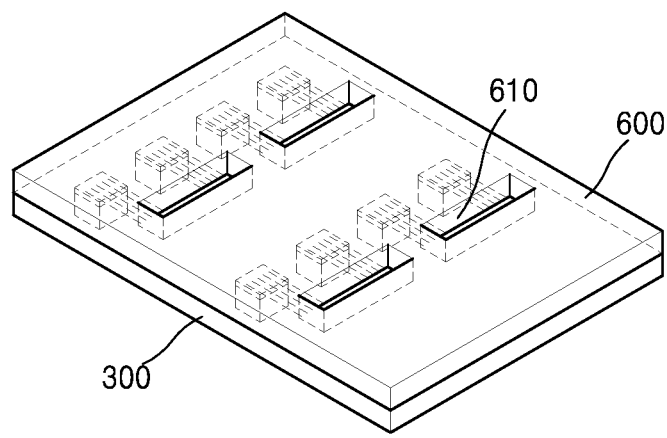
Figure 4I:
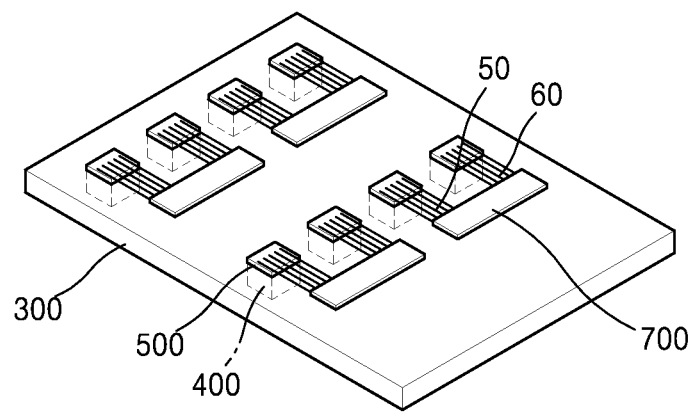

Herein, a figure of step (h) shown in FIG. 4H illustrates a state in which vias 610 are formed on a photoresist layer 600 remained as a pattern 600 for depositing conductive layers for the second electrodes. Then, after an exposure process and a development process are performed, a pattern for depositing the conductive layers for the second electrodes are formed on only the portions where the vias 610 are formed on the photoresist layer 600 as shown in a figure of step (e).

Step (i): Deposition of Second Electrode

After the pattern for depositing the conductive layers for the second electrodes is formed as described above, a conductive layer having a good electrical conductivity is deposited on the pattern through a known chemical vapor deposition process or sputter deposition process to form a second electrode 700.

Step (j): Formation of Protective Layer

After the second electrode 700 is formed as described above, a protective layer (i.e., passivation layer) made of a silicon oxide film may be formed between the first electrode 500 and the second electrode 700. The protective layer 800 may be formed as a silicon oxide film. The protective layer 800 serves to prevent introduction of foreign substances from the outside along with the thermal insulation effect.

Figure 4J:
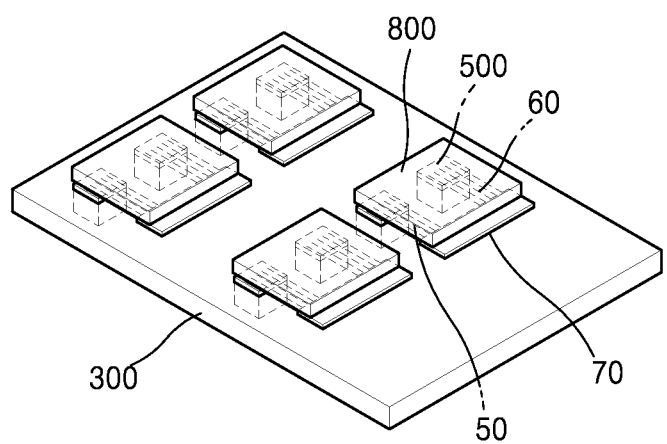
Figure 5A:
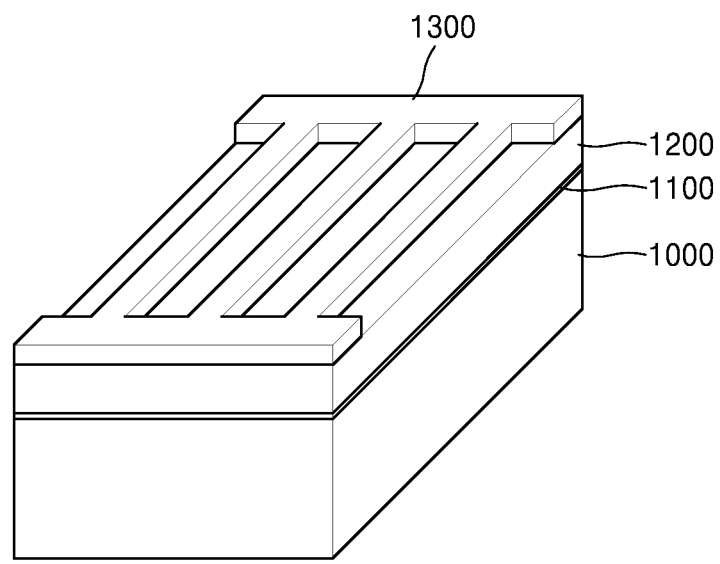
FIGS. 5A to 5F respectively illustrate a manufacturing process chart of a nanowire of a thermoelectric generator module according to the present invention.
Figure 5B:
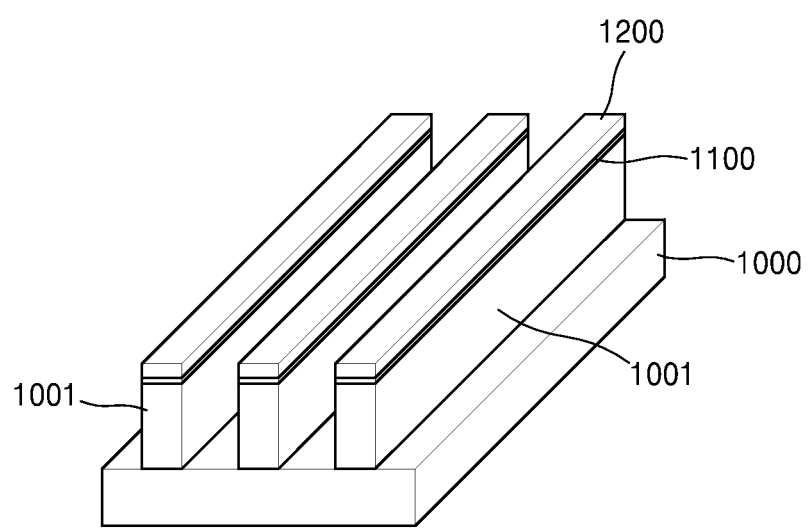
Figure 5C:
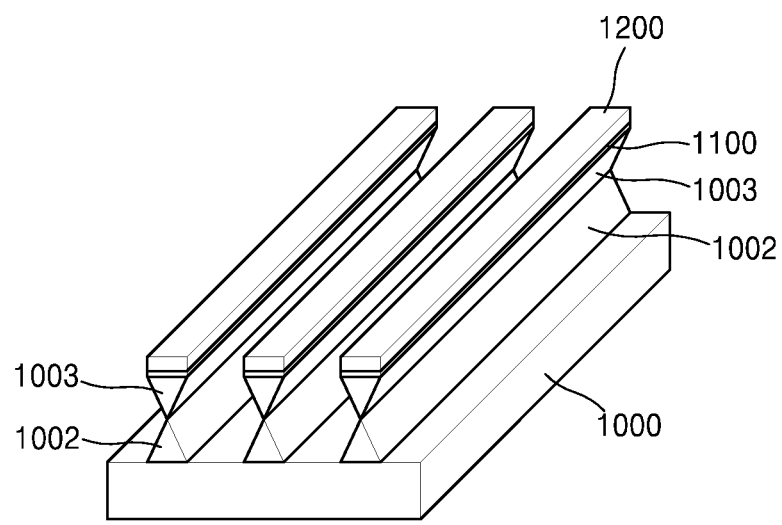
Figure 5D:
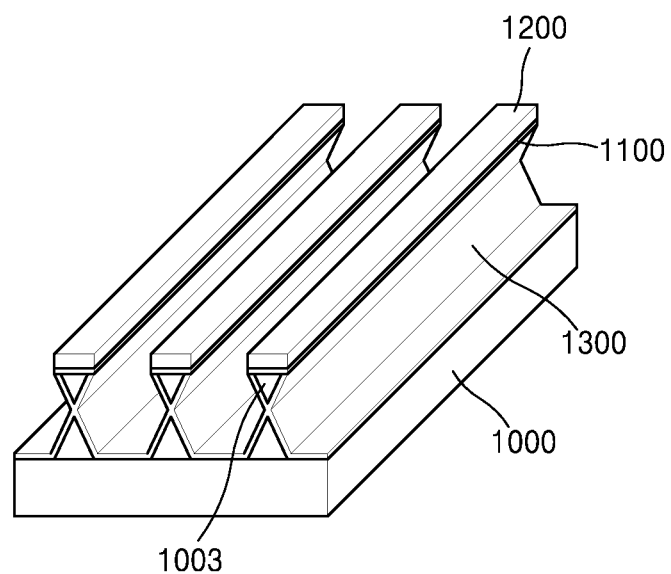
Figure 5E:
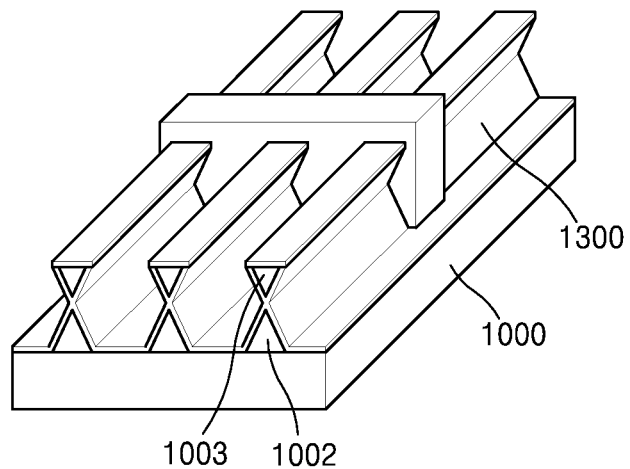
Figure 5F:
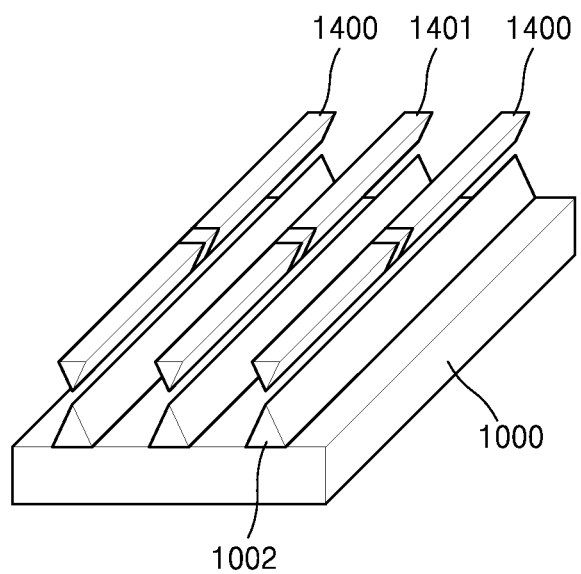
Figure 6A:
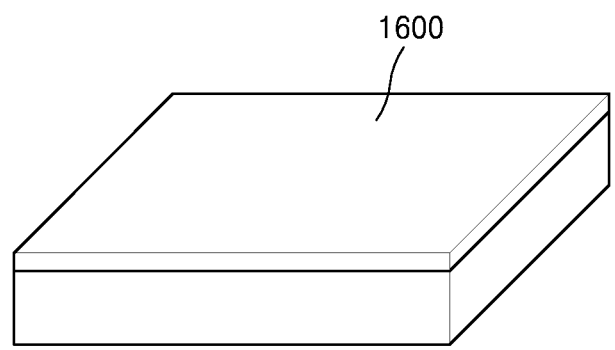
FIGS. 6A to 6D respectively illustrate a transfer process of a nanowire of a thermoelectric generator module according to the present invention.
Figure 6B:
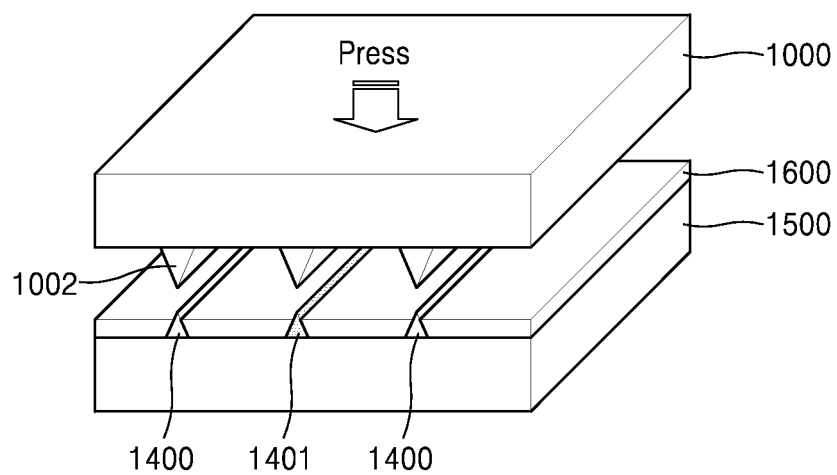
Figure 6C:
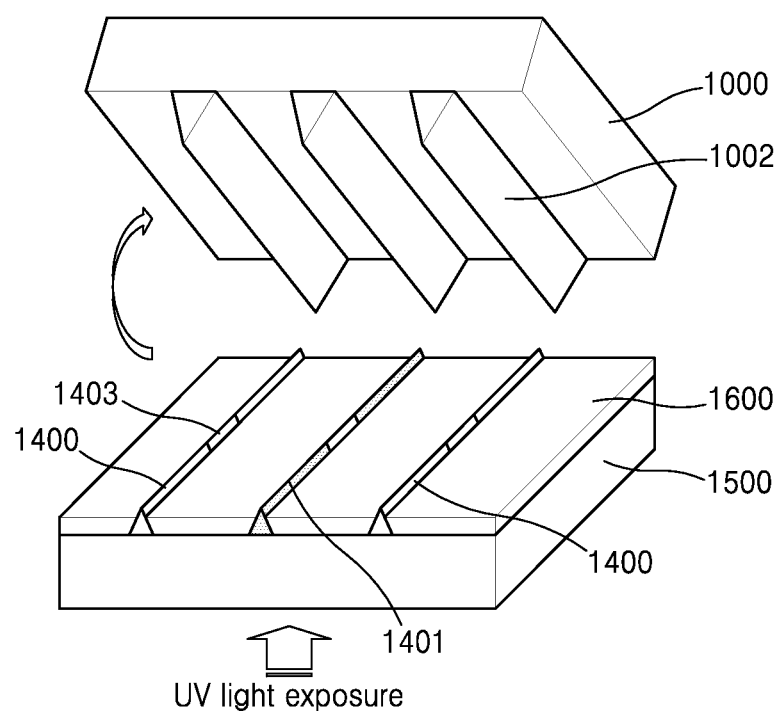
Figure 6D:
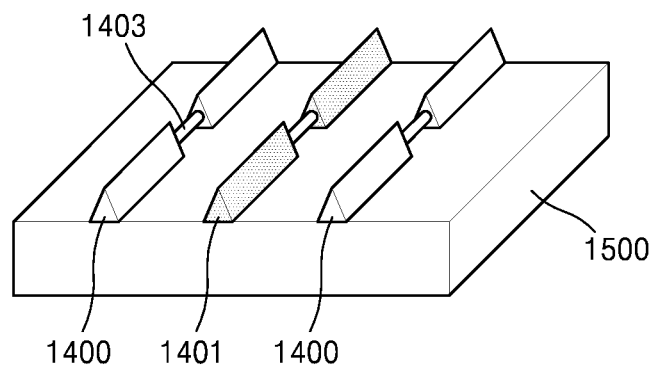

The thermoelectric generator module of the present invention manufactured by the steps as described above can provide a structure in which the first electrodes 500 and the second electrodes 700 are formed on the PDMS layer 300 and are connected to each other by the nanowires 50 and 60 as shown in FIG. 4J.

Next, a manufacture process of nanowires used in the manufacture of the thermoelectric generator module of the present invention will be described.

The manufacture method of the nanowires can be largely classified into two types depending on an approach method.

That is, the manufacture method of the nanowires can be largely classified into can be divided into a top-down method in which a material such as silicon is etched using a ultrafine photolithography process to directly manufacture the nanowire elements at a desired position, and a bottom-up method in which the nanowires are synthesized using a VLS (vapor-liquid solid) growth method and then are aligned at a specific position to manufacture the nanowire elements. The manufacture method of the nanowires of the present invention is the top-down method.

FIGS. 5A to 5F illustrate a manufacturing process chart of a nanowire of a thermoelectric generator module according to the present invention.

The manufacturing process of the nanowires according to the present invention will be described shortly according to steps (a) to (f) enumerated in an alphabetical order in FIGS. 5A to 5F.

Step (a): Formation of Nanowire Pattern

A silicon oxide ($SiO_2$) layer 1100 and a silicon nitride ($Si_3N_4$) layer 1200 are formed on a silicon wafer 1000 substrate, and a straight-shaped pattern 130 for the nanowires is formed on the silicon nitride layer 1200 using the above-mentioned photolithography method.

Step (b): Formation of Trench

After the nanowire-shaped pattern 1300 is formed on the silicon nitride layer 1200, a known reactive ion etching process is performed to etch the pattern 1300 portion to form trenches 1001 serving as bodies for forming the nanowires later.

The trench 1001 is formed in a bar shape which protrudes upwardly vertically from a top surface of on the silicon wafer 1000 in a state in which the silicon oxide ($SiO_2$) layer 1100 and the silicon nitride ($Si_3N_4$) layer 1200 are laminated on the silicon wafer 1000.

Step (c): Etching of Trench

The trench 1001 is etched according to the physical property of the silicon wafer 1000 using an isotropic wet etching method to form a lower triangular portion 1002 having a triangular line and an upper triangular portion 1003 having an inverted triangular line.

Step (d): Separation of Trench

The silicon wafer 1000 on which the trench 1001 is formed is partially oxidized through a known oxidation process to reduce the size of the lower triangular portion 1002 and the upper triangular portion 1003 to separate the lower triangular portion 1002 and the upper triangular portion 1003 from each other. A non-explained reference numeral 1300 denotes the outer walls of the lower triangular portion 1002 and the upper triangular portion 1003.

Step (e): Ion Injection

In order to manufacture an n-type or p-type nanowire, a specific section or position of the upper triangular portion 1003 has an n-type or p-type semiconductor and a specific concentration through a photolithography process and an ion injection process of injecting ions such as As or $BF_2$ into the separated upper triangular portion 1003.

In this case, since the speed of the wet etching varies depending on an ion concentration, a partial etching of adjusting the size of the nanowire according to the adjustment of the ion concentration can be performed on the silicon wafer 1000. Phonon choke parts 51, 61; 1402, 1403 may be formed at a part, generally at the central portion of the nanowire (or the first and second nanowires: see FIGS. 1a, 3a and 5(f)) through such a partial etching process. The phonon choke parts 51,61; 1402,1403 have a substantial effective diameter of 50 nm or less, more specifically a diameter ranging from 20 nm to 50 nm. In case of a charge carrier, a mobility degradation phenomenon according to the surface roughness of the nanowire occurs when the phonon choke parts 51,61; 1402,1403 have a diameter of 10 nm or less. In case of the phonon, the phonon choke parts 51,61; 1402,1403 is influenced by the surface roughness of the nanowire in a diameter ranging from 20 nm to 50 nm. As the diameter of the nanowire is reduced, the propagation of the phonon is degraded due to boundary scattering. In case of the nanowire including the phonon choke parts, the present invention takes a structure in which the nanowire is transferred onto the substrate or the flexible substrate to form a thermoelectric module. The phonon choke part of the present invention has a diameter ranging from 20 to 50 nm to minimize a risk that the phonon choke part will be damaged due to deformation such as bending or torsion.

The phonon choke part having a diameter of 50 nm or less may be formed at only a specific portion of the nanowire so that the movement of the charge carrier is permitted but the movement of phonons is limited so as to substantially interrupt the thermal conductivity due to the nanowires to improve the thermoelectric generation performance. In an example of the present invention, a hybrid thermoelectric module can be implemented, i.e., an electrical flow path is formed on a horizontal plane and a thermal flow path is formed on a vertical plane so that a thermal and electrical path separation structure can be reinforced through the vertical intersection between the thermal flow and the electrical flow to increase the thermoelectric generation efficiency of the module unit body.

Step (f): Completion of Nanowire

After the ion injection as described above is completed to form a desired n-type or p-type semiconductor, the silicon oxide layer 1100 remained on the upper triangular portion 1003, the lower triangular portion 1002, and the outer walls of the upper triangular portion 1003 and the lower triangular portion 1002 is removed by being molten by the buffer oxide etchant method.

Then, both ends of each nanowire is securely fixed on the silicon wafer 100 substrate by a hammer-shaped support (not shown) so that silicon nanowires 1400 and 1401 are finished in a state of being suspended in the air.

FIGS. 6A to 6D illustrate a transfer process of a nanowire of a thermoelectric generator module according to the present invention.

The transfer process of the nanowire of step (g) in the manufacture process of the thermoelectric generator module of the present invention will be described in more detail. For the sake of convenience of explanation, the PDMS substrate layer is denoted by a reference numeral 1500.

The nanowires 1400 and 1401 of the present invention formed through the steps as shown in FIGS. 5A to 5F are transferred onto the PDMS substrate layer 1500 through a transfer process. The transfer process of the nanowires according to the present invention will be described shortly according to steps (a) to (d) enumerated in an alphabetical order in FIGS. 6A to 6D.

Step (a): Formation of Ultraviolet-Cured Layer

An organic layer 1600 such as a UV coating layer to be cured by ultraviolet rays is formed on the PDMS layer 1500.

Step (b): Insertion of Nanowires

The silicon wafer 1000 on which the silicon nanowires 1400 and 1401 are formed in a suspended state is aligned on a top of the PDMS layer 1500 and pressure is downwardly applied to the top of the silicon wafer 1000 to cause the nanowires 1400 and 1401 to be embedded into the organic layer 1600 coated on the PDMS layer 1500.

Step (c): Curing of Organic Layer

After the nanowires 1400 and 1401 are embedded into the organic layer 1600, the silicon wafer 1000 is removed and the organic layer 1600 is exposed to ultraviolet rays to cure the organic layer 1600.

Step (d): Completion of Transfer after Removal of Organic Layer

After the curing of the organic layer 1600 is completed, when the organic layer 1600 is removed by being molten in oxygen plasma or ethanol, the transfer of the PDMS layer 1500 on which the nanowires 1400 and 1401 are formed is completed finally so that a secure transfer state can be maintained.

The thermoelectric generator module of the present invention as constructed above can be applied to a wide range of fields in which heat and electricity are combined, such as an automobile part such as a temperature adjustment seat (e.g., climate C-ntr-l), a semiconductor (e.g., circulator, cooling plate), a biological product (e.g., blood analyzer, PCR, sample temperature cycling tester), a scientific field (spectrophotometer), an optical field (CCD cooling, infrared sensor cooling, laser diode cooling, SHG laser cooling), a computer field (CPU cooling), a home appliance (kimchi refrigerator, mini refrigerator, hot and cold water dispenser, wine refrigerator, rice container, dehumidifier), a power generation field (waste heat generator, remote power generation), etc. In other words, the thermoelectric generator module of the present invention can be modified in various manners within a range of forming a hybrid structure enabling the realization of a large-area module through a structure in which a surface contact is possible for an element whose heat is emitted from a heat source so that the module unit bodies are horizontally arranged perpendicularly to a transfer direction of heat radially emitted from the heat source. Further, the inventive thermoelectric generator module may be utilized as a power source for a portable device such as a smart phone, a tablet or the like through the realization of self-power generation using heat emitted from the human body by taking a structure in which the module is built in a flexible substrate or a structure in which the module is built in a functional fiber as a flexible material.

In addition, the substrate or the electrode is formed of a transparent material or a certain material, and thus the thermoelectric generator module is installed on a glass of a building, a vehicle and the like so that it can be utilized as a power generation facility using an external heat source. Contrarily, as the effects of the present invention, it is apparent from the above contents that the inventive thermoelectric generator module can have a structure in which power is supplied in a predetermined control state to prevent an erroneous operation of the device so that the heat radiation property is improved by an emergency cooling operation in a captured region through a surface contact or a spaced structure (preferably, surface contact)

In addition, the inventive thermoelectric generator module may be constructed in various manners within a range of forming the arrangement of the second electrodes and the first and second electrodes whose one surfaces permitting the inflow and outflow of heat are opposed to each other, such as further including a separate heat transfer improvement layer on both sides of a large area substrate to improve the transfer of heat in a vertical direction to a plane in terms of the characteristics of the hybrid thermoelectric generator module of the present invention.

While the configuration and operation of the hybrid thermoelectric generator module and the method of manufacturing the same of the present invention and the method of manufacturing the same have been described in connection with the exemplary embodiments illustrated in the drawings, they are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical sprit of the appended claims.

What is claimed is:

1. A thermoelectric generator module including a set of module unit bodies disposed between a hot source and a cold source to serve as fundamental structures for performing thermoelectric power generation,
   wherein each of the module unit bodies comprises:
      a substrate being disposed between the hot source and the cold source, the substrate having a first surface which faces one of the hot and cold sources and a second surface which faces another of the hot and cold sources, the second surface being opposite to the first surface;
      a first electrode disposed at one of the hot source and the cold source;
      a second electrode disposed at the other of the hot source and the cold source so as to be spaced apart from the first electrodes;
      a first nanowire composed of an n-type or p-type semiconductor, the first nanowire at one end thereof being directly connected to the first electrode and at the other end thereof directly connected to the second electrode; and
      a second nanowire composed of a conductor or semiconductor of a type different from the type of the semiconductor forming the first nanowire, the second nanowire being connected at one end thereof directly to the first electrode and connected at the other end thereof directly to a second electrode of another module unit body adjoining to the module unit body,
   wherein:
      the second electrode, the first nanowire, and the second nanowire are disposed on and in contact with the second surface of the substrate;
      the first electrode is disposed so as to penetrate through the substrate in such a manner that an upper surface of the first electrode is exposed out from the second surface of the substrate and a lower surface of the first electrode, which is opposite to the upper surface, is exposed out from the first surface of the substrate.

2. The thermoelectric generator module according to claim 1, wherein the first electrode and the second electrode are disposed on a co-plane,
   wherein the first nanowire extends from the first electrode and is connected to the second electrode in the same module unit body, which is disposed so as to be spaced apart from the first electrode, and the second nanowire is connected to the second electrode in the adjoining module unit body, and
   wherein the first electrode, the first nanowire, and the second nanowire of at least one of the module unit bodies form a "ㄷ" shape.

3. The thermoelectric generator module according to claim 2, wherein the module unit bodies including the module unit body consisting of the first electrodes, the first nanowire, and the second nanowire, which form the "ㄷ"

shape, are consecutively arranged in series on the substrate to capture any one heat source.

4. The thermoelectric generator module according to claim 1, further comprising a heat shielding protective layer disposed on the second surface of the substrate.

5. The thermoelectric generator module according to claim 4, wherein the heat shielding protective layer is coated on the first nanowire, the second nanowire, and the first electrode, without being coated on the second electrode.

6. The thermoelectric generator module according to claim 5, wherein the heat shielding protective layer comprises at least one of a ceramic based material such as $ZrO_2$, $SiO_2$, $Al_2O_3$, $TiO_2$, SiC or $ZrO_2$ and polymer.

7. The thermoelectric generator module according to claim 4, wherein the substrate is a flexible substrate.

8. The thermoelectric generator module according to claim 7, wherein the flexible substrate is formed of any one selected from among Polydimethylsiloxane (PDMS), polyimide, polycarbonate, Poly(methyl methacrylate) (PMMA), cyclic olefin copolymer (COC), parylene, polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, cyclic olefin polymer (COP), polyethylene (PE), polyprophylene (PP), polystyrene (PS), polyoxymethylene (POM), poly(ether ether ketone) (PEEK), polyether sulfone (PES), polytetrafluoroethylene (PTFE), polyvinyl chloride (PVC), polyvinylidene fluoride (PVDF), and perfluoroalkyl ethyl acrylate (PFA), or a combination thereof.

9. The thermoelectric generator module according to claim 1, wherein the first nanowire and the second nanowire are connected to the first electrode and the second electrode by a transfer technique.

10. The thermoelectric generator module according to claim 9, wherein the first nanowire or the second nanowire comprises a phonon choke part having a diameter of 50 nm or less.

11. The thermoelectric generator module according to claim 1, wherein the first nanowire extends in a length direction from the first electrode to the second electrode, and the length direction of the first nanowire is perpendicular to a thickness direction of the substrate.

* * * * *